United States Patent [19]

Schimmelpfennig et al.

[11] Patent Number: 4,516,027
[45] Date of Patent: May 7, 1985

[54] INFRARED DETECTOR

[75] Inventors: Wolfgang Schimmelpfennig, Schönau; Heinz-Jürgen Siede, Bad Neustadt, both of Fed. Rep. of Germany

[73] Assignee: Preh Elektrofeinmechanische Werke Jakob Preh Nachf. GmbH & Co., Bad Neustadt, Fed. Rep. of Germany

[21] Appl. No.: 460,568

[22] Filed: Jan. 24, 1983

[30] Foreign Application Priority Data

Jan. 29, 1982 [DE] Fed. Rep. of Germany ....... 3202819

[51] Int. Cl.$^3$ .............................................. G01J 5/10
[52] U.S. Cl. ................................... 250/338; 250/342; 204/192 C
[58] Field of Search ........................ 250/338, 342, 339

[56] References Cited

U.S. PATENT DOCUMENTS

| | | | |
|---|---|---|---|
| 3,586,439 | 6/1971 | Treharne et al. | 356/43 |
| 3,928,768 | 12/1975 | Crowell | 250/333 |
| 4,367,408 | 1/1983 | Imai et al. | 250/339 |
| 4,379,971 | 4/1983 | Smith et al. | 250/342 |
| 4,384,207 | 5/1983 | Doctor | 250/349 |
| 4,404,468 | 9/1983 | Kleinschmidt | 250/342 |

OTHER PUBLICATIONS

"In-Line Production System for Sputter Deposition of Graded Index Solar Absorbing Films", by D. R. McKenzie, B. Window, G. L. Harding, A. R. Collins and D. W. J. Mackey, *J. Vac. Sci. Technol.*, 19(1), May/Jun. 1981, pp. 93–95.

"Über die Optischen Konstanten Dünner Metallschichten im Langwelligen Ultrarot", Von Wilhelm Woltersdorff, *Zeitschrift fur Physik*, vol. 91, pp. 230–252, dtd., 7/27/34.

"Influence of Black Coatings on Pyroelectric Detectors", *Applied Optics*, vol. 13, No. 5, pp. 1171–1178, May 1974.

"The Influence of Ion Bombardment During Condensation on the Properties of Vacuum-Deposited Thin Films", *Chemical Abstracts*, vol. 91, No. 10, pp. 1 & 484 plus addendum page, Sep. 3, 1979.

"The Effect of the Substrate Temperature on the Optical Properties of Reactively Evaporated Silicon Oxide Films", *Chemical Abstract*, vol. 87, No. 10, pp. 1 & 519, Sep. 5, 1977.

"Hochempfindliches Bolometer", *Elektronik Notizen*, vol. 28, No. 11, p. 11; 1979.

*Primary Examiner*—Alfred E. Smith
*Assistant Examiner*—Carolyn E. Fields
*Attorney, Agent, or Firm*—Woodcock Washburn Kurtz Mackiewicz & Norris

[57] ABSTRACT

Contactlessly operating detectors which are accommodated in a casing provided with a window and which exploit the pyroelectric effect (FIG. 1) are being increasingly used for radiation and temperature measurement. In particular for applications in the infrared range of the spectrum, the manufacture of a suitable absorption layer causes difficulties in achieving the necessary adhesion properties. The absorption layer must have a high degree of adhesion and bonding brought about by gluing, soldering or welding. For this purpose it is proposed that the layer be very thin and comprise a chemically resistant, electrically conductive compound of metals and their oxides such as tin and tin-oxide or silicon and silicon oxide. In addition, these layers are characterized by a degree of surface roughness which is approximately equal to or higher than the wavelength of the radiation to be absorbed.

8 Claims, 3 Drawing Figures

Fig.1
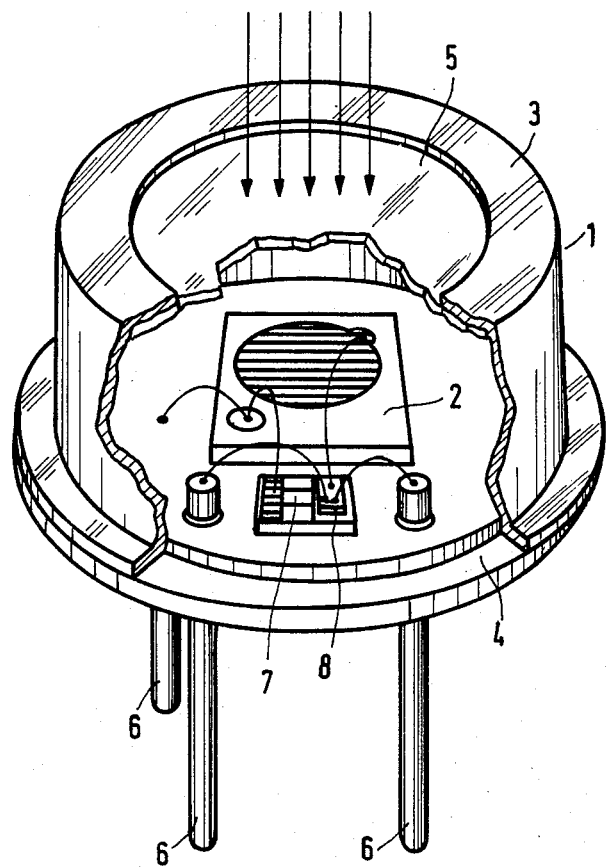
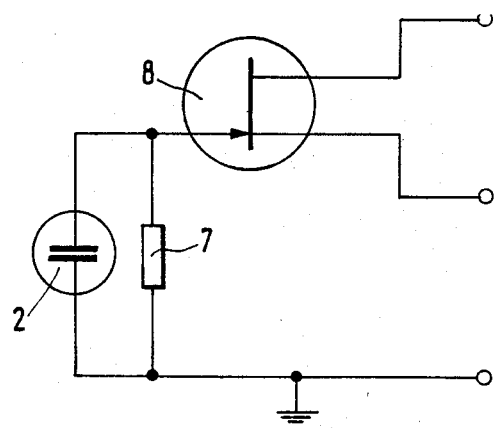
Fig.2

INFRARED DETECTOR

DESCRIPTION OF THE PRIOR ART

This invention concerns an infrared detector comprising a system of multiple layers applied to a substrate, wherein the uppermost layer is an infrared absorbing layer.

Contactless operating detectors are being increasingly required for radiation and temperature measurement. These radiation receivers (detectors) convert infrared radiation into electric, optical or mechanical signals. A distinction is made between non-quantum detectors (thermal detectors) and quantum detectors (light detectors). Non-quantum detectors detect changes in vibrational and/or rotational energy states in a crystal lattice due to the absorption of infrared radiation. They do not respond to quantums of energy but to radiated power. Quantum detectors, however, detect changes in electronic states at the atomic level of the crystal lattice due to the absorption of infrared radiation. Quantum detectors respond to quantums of energy (photons). They are also referred to as quantum counters.

A whole series of physical effects are observable by the use of non-quantum detectors, e.g. the Seebeck-effect, the Bolometer-effect, the thermopneumatic effect, the Ettinghausen-Nernst-effect, the thermo-optical effect and, last but not least, the pyroelectric effect.

Detectors making use of the pyroelectric effect have only appeared on the market during the last few years and have attained a respectable market share due to their sturdy structure and simple operation. These receivers exploit the temperature dependence of the spontaneous polarization of so-called ferroelectric crystals or ceramics which, due to their unsymmetric crystalline structure, exhibit a dipole character and hence permanent electric polarization. The pyroelectric detector is basically a capacitor which is sensitive to radiation. A change in temperature due to radiation absorption produces a change in polarization which results in a change in the potential difference at the capacitor. This potential difference can be measured as a voltage or current change, using a suitable amplifier circuit. Since the photosignal and the noise signal change almost evenly with increasing modulation frequency, the detection capacity (proportional to the signal/noise ratio) remains constant over a large frequency range. Mainly TGS (triglycine sulphate) is used as a material for pyroelectric detectors, but in recent times sintered ceramics made of BSN (barium-strontium niobate), PZT (lead-zirconium titanate) or PLZT (lanthanum-doped lead-zicronium titanate) are also being used.

For radiation measurement such detector systems require radiation absorbing surfaces, the manufacture of which is difficult due in part to necessary adhesion requirements. Radiation absorption occurs as a result of the heating of the detector systems. This leads to the temperature-dependent physical effects which are utilized for radiation measurement. Special absorption layers, which exhibit an even degree of absorption over a wide wavelength range, are required particularly for applications in the infrared range of the spectrum.

There are numerous manufacturing methods for such absorption layers.

An example of such a manufacturing method is the vacuum metallization of so-called black gold, a layer of gold which is vacuum metallized in a poor vacuum and which thus produces a granular surface structure. This layer, however, has disadvantages with respect to its adhesive capacity. Apart from the use of "black gold" as an infrared absorbing layer, "Woltersdorff layers", which were already described in 1934 in the "Zeitschrift fur Physik", vol. 91, pp. 230 et seq., may also be used. The manufacture of these thin metal layers, which lie in the range of $10^{-8}$ cm, is difficult because of the surface roughness of the substrate material and the dependence of the absorption on the wavelength.

Another process is more favorable for producing these infrared absorbing layers.

This method of obtaining infrared absorbing layers is described by D. R. Mckenszie, B. Window, G. L. Harding, A. R. Collins and D. W. J. Mackey in the Journal of Vacuum Scientific Technology, 1981, vol. 19, p. 93. In accordance with this process, metal layers containing carbon are deposited using a certain gas discharge - sputtering technique in a gas atmosphere partly containing acetylene. However, this process has several drawbacks; the sputtering means are badly soiled with carbon-containing metal layers which are difficult to remove and, the electric contacting of the layers to adherent connections (3.g. wires) is difficult, (the latter being required particularly in the case of systems which, by way of example, make use of a capacitor as a temperature or radiation sensitive system, e.g. pyroelectric radiation detectors).

SUMMARY OF THE INVENTION

This invention comprises an infrared detector in which the uppermost layer is very thin and consists of a chemically resistant and electrically conductive compound of metals and their oxides, e.g. tin and tin oxide or silicon and silicon oxide, wherein this layer has a degree of surface roughness which is approximately equal to or greater than the wavelength of the radiation to be absorbed.

It is therefore an object of the present invention to provide an infrared detector comprising a system of multiple layers applied to a substrate which is inexpensive in its manufacture. It is also an object of the invention to provide an infrared detector in which the uppermost infrared absorbing layer not only adheres well to the layer below but also has a good bonding capacity when glued, soldered or welded.

Further objects and advantageous embodiments of the invention will become apparent from the following description and claims.

BRIEF DESCRIPTION OF THE DRAWINGS

One embodiment example of the invention will now be described in more detail in the following with reference to the drawing.

In the drawing

FIG. 1 shows a partial sectional perspective view of an infrared detector constructed in accordance with this invention.

FIG. 2 shows a circuit diagram of the infrared detector of FIG. 1.

DETAILED DESCRIPTION OF A PREFERRED EMBODIMENT OF THE INVENTION

Figure 3:
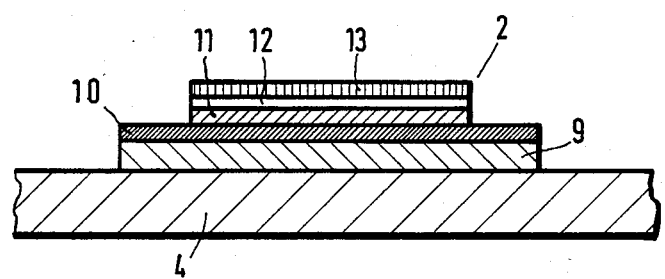
FIG. 3 shows a side sectional view of the detector element.

The infrared detector comprises a casing 1 in which the detector of this invention element 2 is assembled.

The casing 1 itself comprises a casing cover 3 and a base 4. An opening is left at the upper side of the casing cover 3 and is covered by a window 5 which is permeable to infrared radiation. Three connection pins 6 protrude from the bottom side of the casing 1. Two of these connection pins extend through the base 4 and are insulated therefrom. One of the connection pins is connected to the base which acts as ground.

The actual detector element 2 and an electric circuit, shown in FIG. 2, are situated in the interior of the casing cover 3. A by-pass resistor 7 is connected parallel to the detector element 2, one of whose connections is grounded and the other of which is connected to the gate terminal of a field effect transistor 8. The drain and source terminals are connected separately to the connection pins 6. As already mentioned, the third connection pin is connected to the casing which is grounded.

FIG. 3 shows a sectional view of the detector element itself with its system of multiple layers. On the base 4 of the casing 1 is disposed a heat insulating base layer 9 comprising, for example, aluminum oxide adhered to the base. Above this base layer 9 is a layer 10 comprising an electrically conductive material on which a pyroelectric crystal 12 is disposed and which is metallized on one or both sides with a base electrode 11. The layer 10 and the base electrode 11 can also be combined to form a single layer if one succeeds in depositing the pyroelectric crystal 12 directly on the electrically conductive layer 10. A metal foil, e.g. a nickel or aluminum foil, may be provided as a material for the layer 10. The pyroelectric crystal 12 is covered on its upper side by an infrared absorbing layer 13.

The following examples illustrate methods for manufacturing this infrared absorbing layer 13. The application of this layer may be accomplished according to several different processes, e.g. vacuum metallization, high-capacity sputtering or cathodic sputtering.

The known cathodic sputtering process is preferred. This process is more advantageous than the vacuum metallization process since the excited ions contained in the plasma are directly reacted instead of only using the kinetic energy of the particles as in the case of vaporization.

In the reactive cathodic sputtering process, a black tin/tin-oxide layer is first applied reactively in an argon-/oxygen atmosphere to the radiation or temperature sensitive pyroelectric crystal system in the vacuum. This is done after prior masking of the individual detector elements should a plurality of the latter have been manufactured together in multiple production in the preceding operational steps. By means of accelerated inert gas ions, metal atoms are dissolved from a cathode, the so-called target, which then condense on the crystal. In this manner a tin/tin-oxide layer, which is not stoichiometric, is applied in a thickness of preferably 4 $\mu$m to the crystals. In contrast to the usual process wherein the targets are normally cooled or slightly tempered, the target in this process is heated to a high temperature which is preferably in the region of the melting point or which may even be higher. Experiments have shown that a compound of metal/metal-oxides may be obtained under these temperature conditions. The reactive application of the tin/tin-oxide is carried out in an oxygen/inert gas atmosphere, and the pressure ratio of oxygen to inert gas should be between 1:50 and 1:200. A partial pressure of $8 \times 10^{-5}$ Torr was selected for oxygen and $8 \times 10^{-3}$ Torr for an inert gas, e.g. argon. When the desired layer thickness has been achieved by varying the vacuum metallization time, a black, soundly adhering, granular tin/tin-oxide layer is obtained which has a granular size equal to or larger than the wavelength of the infrared radiation to be absorbed in the range of 1-20 $\mu$m. The thickness of the layer is to be kept as small as possible so as to maintain the heating capacity of the system at a minimum. At the same time, the layer must be thick enough to achieve a sufficient amount of radiation absorption in the layer. The amount of infrared absorption measured with an infrared spectrometer is around 70%, and the metallic conductivity of this tin/tin-oxide layer makes it suitable for use in capacitive detector systems (pyroelectric heat radiation detectors being one example thereof) which exploit the change in the electric polarization of a crystal layer contained in a capacitor system in which the temperature change results in a physical effect. Apart from tin, silicon or its oxide may also be used as the metal.

The infrared absorbing layer should have a degree of surface roughness which is approximately equal to or larger than the wavelength of the radiation to be absorbed. The optical reflectivity of the layer depends on its surface roughness. In the case of metallic conductive layers having a lesser degree of surface roughness in comparison to the wavelength of the optical radiation, geometric reflection can be expected. If the roughness is increased, the reflection changes to diffuse scattering and finally to noticeable absorption.

In the layer, the non-metal portion of the metal compound should be less than one would expect by examining the stoichiometric weight ratio. If one were to have a stoichiometric weight ratio of the portions and metal/metal-oxide this would mean that a relatively poor degree or electrical conductivity could be expected. However, since the layer should have a high degree of electrical conductivity, the non-metallic portion must be lower than a value that corresponds to the stoichiometric weight ratio. Good electrical conductivity is required because the layer is at the same time an electrode of the pyroelectric capacitor system.

What is claimed is:

1. An infrared detector for absorbing and detecting infrared radiation comprising a system of multiple layers applied to a substrate wherein the uppermost layer is an infrared absorbing layer and comprises a chemically resistant and electrically conductive compound of a preselected metal and its oxide, said absorbing layer having a degree of surface roughness approximately equal to or greater than the wavelengths of the infrared radiation to be absorbed.

2. The infrared detector of claim 1 wherein said metal is tin.

3. The infrared detector of claim 1 wherein said metal is silicon.

4. The infrared detector of claim 1 wherein the non-metal portion of said compound in said absorbing layer is less than the stoichiometric ratio.

5. The infrared detector of claim 1, wherein said infrared radiation comprises wavelengths less than 20$\mu$ and said absorbing layer comprises a granular layer having a granular size at least as great as 20$\mu$.

6. An infrared detector comprising:
a heat insulating base layer;
a conductive layer above said base layer comprising an electrically conductive material;
a base electrode adjacent said conductive layer;

a pyroelectric crystal disposed on said base electrode, said crystal being metallized on at least one side; and an infrared absorbing layer, said absorbing layer covering said crystal on its upper side, wherein said absorbing layer is granular and has a granular size at least as great as 20μ.

7. A method of making an infrared detector for absorbing and detecting infrared radiation, said detector comprising a system of multiple layers applied to a substrate wherein the uppermost layer is an infrared absorbing layer and comprises a chemically resistant and electrically conductive compound of a preselected metal and its oxide, said absorbing layer having a degree of surface roughness approximately equal to or greater than the wavelengths of the infrared radiation to be absorbed; said method comprising:

applying said absorbing layer reactively in a high-vacuum by thermal vaporization.

8. A method of making an infrared detector for absorbing and detecting infrared radiation, said detector comprising a system of multiple layers applied to a substrate wherein the uppermost layer is an infrared absorbing layer and comprises a chemically resistant and electrically conductive compound of a preselected metal and its oxide, said absorbing layer having a degree of surface roughness approximately equal to or greater than the wavelengths of the infrared radiation to be absorbed; said method comprising applying said absorbing layer by reactive sputtering in an atmosphere comprising oxygen and at least one inert gas.

* * * * *